United States Patent
Niebler et al.

(10) Patent No.: US 12,265,001 B2
(45) Date of Patent: Apr. 1, 2025

(54) METHOD OF STATUS MONITORING

(71) Applicant: Siemens Aktiengesellschaft, Munich (DE)

(72) Inventors: Ludwig Niebler, Laaber (DE); Bernhard Streich, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 726 days.

(21) Appl. No.: 17/205,228

(22) Filed: Mar. 18, 2021

(65) Prior Publication Data

US 2021/0302277 A1 Sep. 30, 2021

(30) Foreign Application Priority Data

Mar. 26, 2020 (EP) .................................... 20165853

(51) Int. Cl.
*G05B 19/042* (2006.01)
*G01M 99/00* (2011.01)
*G01R 19/10* (2006.01)

(52) U.S. Cl.
CPC .......... *G01M 99/005* (2013.01); *G01R 19/10* (2013.01); *G05B 19/0428* (2013.01); *G05B 2219/21154* (2013.01)

(58) Field of Classification Search
CPC . G01M 99/005; G01R 19/10; G05B 19/0428; G05B 2219/21154; G05B 23/0235
See application file for complete search history.

(56) References Cited

U.S. PATENT DOCUMENTS

| 5,973,499 A | 10/1999 | Schulmann |
| 6,765,316 B1 | 7/2004 | Elsner et al. |
| 9,234,922 B2 | 1/2016 | Behringer et al. |
| 10,368,451 B2 | 7/2019 | Comtois et al. |

(Continued)

FOREIGN PATENT DOCUMENTS

| DE | 19546553 C1 | 5/1997 |
| DE | 19948551 C1 | 7/2001 |

(Continued)

OTHER PUBLICATIONS

European Search Report for European Patent Application No. 20165853 dated Sep. 25, 2020.

*Primary Examiner* — Kamini S Shah
*Assistant Examiner* — Mohammed Shafayet
(74) *Attorney, Agent, or Firm* — Harness, Dickey & Pierce, P.L.C.

(57) ABSTRACT

A method is for status monitoring at least one of two or more current-carrying electrical components, suppliable with electrical energy from an electrical energy source via a common current feed line and from the common current feed line in each case via a separate current supply line, individually openable or closable. In an embodiment, the method includes detecting measured values of an electrical variable in the common current feed line before and after opening or closing one or a plurality of the current supply lines; calculating a difference between a measured value detected before opening or closing and a measured value detected after opening or closing; and determining a status change of at least one of the two or more components based upon a time series of the difference.

17 Claims, 10 Drawing Sheets

(56) References Cited

U.S. PATENT DOCUMENTS

| | | | |
|---|---|---|---|
| 10,393,809 B2* | 8/2019 | Bock | H01H 50/002 |
| 2005/0013085 A1* | 1/2005 | Kinsella | H02P 25/18 |
| | | | 361/162 |
| 2005/0122117 A1* | 6/2005 | Baurand | H01H 1/0015 |
| | | | 324/421 |
| 2007/0067678 A1 | 3/2007 | Hosek et al. | |
| 2011/0116196 A1* | 5/2011 | Kellis | H02H 7/0816 |
| | | | 361/30 |
| 2013/0173186 A1* | 7/2013 | Lim | G01R 31/00 |
| | | | 702/58 |
| 2013/0278269 A1* | 10/2013 | Steck | B60L 58/24 |
| | | | 324/418 |
| 2016/0131712 A1* | 5/2016 | Bock | H01H 50/323 |
| | | | 324/537 |
| 2020/0328039 A1* | 10/2020 | Backman | H01H 9/563 |

FOREIGN PATENT DOCUMENTS

| | | |
|---|---|---|
| DE | 102005043895 B4 | 7/2007 |
| DE | 102018203669 A1 | 9/2019 |
| EP | 3361424 A1 | 8/2018 |
| KR | 101322434 B1 | 10/2013 |

* cited by examiner

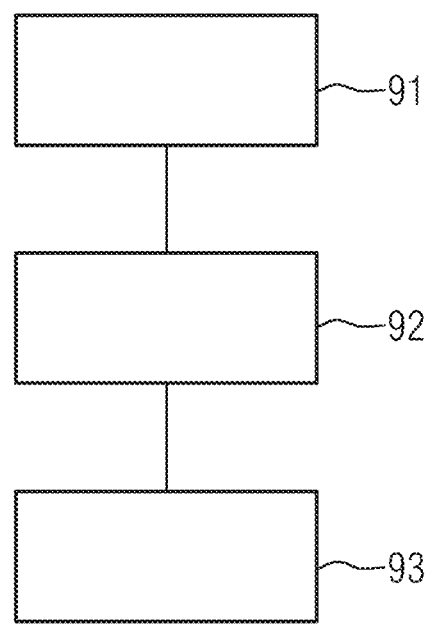

METHOD OF STATUS MONITORING

PRIORITY STATEMENT

The present application hereby claims priority under 35 U.S.C. § 119 to European patent application number EP 20165853.1 filed Mar. 26, 2020, the entire contents of each of which are hereby incorporated herein by reference.

FIELD

Embodiments of the invention generally relate to a method for status monitoring current-carrying electrical components. Embodiments of the invention also generally relate to a control and measuring device which is equipped to carry out the method. Similarly, embodiments of the invention generally relate to a computer program product with which the method can be performed.

BACKGROUND

Unplanned downtime periods of technical installations, for example assembly lines, belt conveyors or ventilation systems, the causes of which are frequently a failure of installation components as a result of wear, usually bring about high costs for the operator. It is therefore in the interest of operators of technical installations to discover critical wear of an installation component before it results in the failure of the installation component and to replace the worn installation component at a suitable point in time in a preventative manner (predictive maintenance). In the case of electrically operated installation components, the current state of wear of the installation component can be estimated by observing the current which flows to the electric drive and by way of comparison with corresponding values at earlier points in time, for example. In the case of electro-mechanical switching devices, the state of wear can be approximated by counting the switching cycles and measuring the switched current strength.

U.S. Pat. No. 10,368,451 B2 (Schneider Electric Industries SAS) 30.07.2019 describes a connection device with which a power switch can be electrically and mechanically connected to a contactor. A module is arranged in the connection device which detects the current flow through the electrical connecting lines. The module has a processor and a bus interface with which the measured current values can be transmitted to a superordinate control system. Information regarding the status of a connected electrical consumer can be acquired via current values of this type, see EP 3361424 A1 (ABB Technology Oy) 15.08.2018, for example, wherein a computer-based method is described with which the remaining lifespan of an electrical consumer can be estimated from measured data such as current strength.

SUMMARY

The inventors have discovered that the solution known from U.S. Pat. No. 10,368,451 B2 has the disadvantage that such a module with current measurement, processor and interface must be arranged in every branch for an electrical consumer in order to acquire the corresponding data from the consumer which is to be monitored. This means that the advantages of the system described in U.S. Pat. No. 10,368,451B2 can only be achieved at great expense.

Therefore, an improved method for status monitoring is provided.

An embodiment of the invention is directed to a method for status monitoring at least one of two or more current-carrying electrical components, to which electrical energy is suppliable from an electrical energy source via a common current feed line and from the common current feed line via a separate current supply line, of a plurality of current supply lines, to each respective at least one of two or more current-carrying electrical components, the at least one of two or more current-carrying electrical components being individually openable or closable via a switching process, the method comprising:
  detecting measured values of an electrical variable in the common current feed line before and after a switching process in one of the current supply lines or a plurality of the current supply lines;
  calculating a difference between a measured value detected before the switching process and a measured value detected after the switching process; and
  determining a status change of at least one of the two or more components based upon a time series of the difference.

An embodiment of the invention is directed to a control and measuring device, comprising:
  a sensor to detect measured values of an electrical variable in a current feed line before and after a switching process in one or a plurality of current supply lines, wherein electrical current is carried to two or more current-carrying electrical components from an electrical energy source via a common current feed line and wherein the electrical current is carried from the common current feed line of a plurality of current supply lines, to each respective at least one of two or more current-carrying electrical components, the at least one of two or more current-carrying electrical components being individually openable or closable via the switching process; and
  a processor to
    calculate a difference between a measured value, detected before the switching process, and a measured value, detected after the switching process, and
    determine a status change of at least one of the two or more components based upon a time series of the difference.

An embodiment of the invention is directed to a non-transitory computer program product storing a computer program for status monitoring at least one of two or more current-carrying electrical components, the computer program being executable in a processor of a control and measuring device and being designed to perform the method of claim 1 when executed by the processor.

An embodiment of the invention is directed to a non-transitory computer readable medium storing a computer program for status monitoring at least one of two or more current-carrying electrical components, the computer program being executable in a processor of a control and measuring device and being designed to perform the method of claim 1 when executed by the processor.

BRIEF DESCRIPTION OF THE DRAWINGS

FIG. 10 shows a flow diagram of the disclosed method.

DETAILED DESCRIPTION OF EXAMPLE EMBODIMENTS

Figure 1:
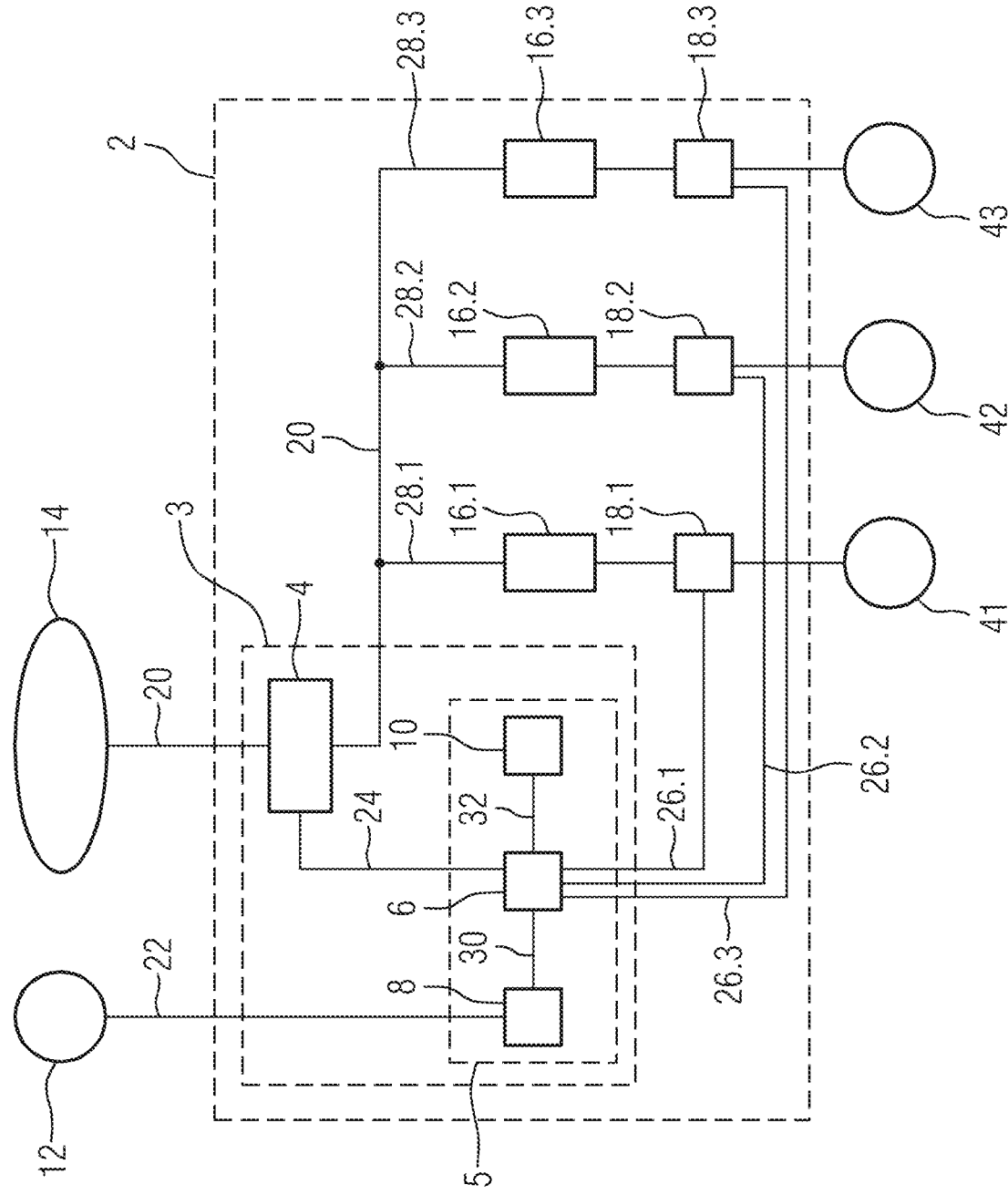
FIG. 1 shows a current distribution device.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In an embodiment, the method is used for status monitoring at least one of two or more current-carrying electrical components. Status monitoring, or condition monitoring, is based on regular or permanent detection of the status of a current-carrying electrical component, for example a switching device or an electric motor, or the status of an installation component driven by a current-carrying electrical component, in particular by an electric motor, for example a machine or any other technical installation, by measuring and analyzing electrical variables, for example of current or voltage. Current-carrying electrical components are components which can interrupt and/or produce a current flow (e.g. switching devices) and machines (e.g. electric motors) which can generate a movement via a current flow. Both current-carrying electrical components and installations or installation components which are driven by current-carrying electrical components are also summarized under the term "consumer" hereinafter.

The electrical energy is supplied to the current-carrying electrical components via a current distribution device, which has electrical lines, from an electrical energy source, for example an electricity network. In order to maintain the transport of the electrical energy from the energy source to the current-carrying electrical components, i.e. a current flow, an electrical voltage is applied between the electrical energy source and the current-carrying electrical components.

The current distribution device has a common current feed line and separate current supply lines which branch off from it. The current flow from the electrical energy source to the two or more current-carrying electrical components runs in a first current line section via the common current feed line; common means that the entire current flow to all of the two or more current-carrying electrical components runs via this current feed line. The current flow from the common current feed line to the two or more current-carrying electrical components runs in a second current line section, which is downstream of the first current line section in the current flow direction, in each case via a separate current supply line. A separate current supply line is therefore assigned to each of the two or more current-carrying electrical components, which current supply line can be individually switched to block current (switching state of the switching device: open) or to conduct current (switching state of the switching device: closed) via a switching device.

Switching the current supply line into a current blocking state, i.e. disconnecting an electrically conductive connection, is referred to in this description, similarly to the corresponding open switching state of the switching device, briefly as opening the current supply line or simply as opening. Switching the current supply line into a current conducting state, i.e. producing an electrically conductive connection, is referred to in this description, similarly to the corresponding closed switching state of the switching device, briefly as closing the current supply line or simply as closing. Opening, i.e. interrupting the current flow, and closing, i.e. producing and maintaining the current flow, a separate current supply line can take place by way of a switching device inserted into the separate current supply line, which switching device is based on an electromechanical and/or electronic switching mechanism. The switching device can be configured as a contactor or a power electronic switching element, for example a transistor. Opening and closing are referred to as a switching process, i.e. a switching process in a current supply line changes the state of the current supply line from current blocking to current conducting, or vice versa.

The common current feed line and the separate current supply lines can be configured for a single-phase or a multiphase current line from an electrical energy source to the two or more current-carrying electrical components. For a single-phase current line, it is sufficient if the common current feed line and the separate current supply lines each have one single conductor and a return conductor or a neutral conductor. For a three-phase current line, i.e. in a three-phase network for three-phase alternating current, it is sufficient if the common current feed line and the separate current supply lines each have three separate conductors-a conductor for each of the three current phases; a neutral conductor may additionally be present. In this case, a conductor of a single-phase or multiphase current line is also referred to as a current path. In this case, a conductor of a multiphase current line is also referred to as a current phase.

In an embodiment, the method comprises a first method step in which measured values of at least one electrical variable are detected in the common current feed line before and after the current supply line is switched to block current or switched to conduct current. For this purpose, a sensor, which is arranged on the common current feed line, of the control and measuring device, for example a current transformer or a current measuring resistor, can detect measured values of at least one electrical variable, for example a current strength or a voltage difference, which occur in the common current feed line before and after the switching process in one or a plurality of the current supply lines, i.e. before and after opening or closing one or a plurality of the current supply lines. Other physical variables, for example magnetic flux, magnetic flux density, temperature, can be derived from the at least one detected electrical variable.

The method comprises a second method step which follows the first method step and in which a difference between a measured value detected before the switching process and a measured value detected after the switching process is calculated. In the case that the current strengths are detected as measured values, this calculation of a difference is referred to as a differential current measurement in the context of this description. For this purpose, a processor of the control and measuring device can receive measured values detected by the sensor, i.e. a measured value detected before the switching process and a measured value detected after the switching process, and can calculate a difference between the measured value detected before the switching process and the measured value detected after the switching process therefrom.

The method comprises a third method step which follows the second method step and in which a status change of at least one of the two or more current-carrying electrical components is determined based upon a time series of the difference. The time series is a chronological sequence of the difference of a specific electrical variable. For this purpose, the processor of the control and measuring device can compare a difference assigned to a first point in time with at least one difference assigned to a second, third, etc. point in time deviating from the first point in time and derive from this a change of a status of at least one of the two or more current-carrying electrical components.

A time series of the difference, acquired from a current-carrying electrical component can be referred to as a footprint of the current-carrying electrical component; the footprint therefore characterizes the status of the current-carrying electrical component at a specific point in time. Status changes occurring over the life cycle of the current-carrying electrical component, i.e. deviations of a current footprint from a footprint of the current-carrying electrical component in a previous status of the current-carrying electrical component can be an indication of incipient wear of the component. On this basis, a targeted servicing of individual current-carrying electrical components can be carried out.

Apart from wear of the current-carrying electrical component itself, wear of an installation component driven by the current-carrying electrical component can also be the cause of changes in the footprint. For example, it is possible that an increase of a current drawn from an electric motor which serves as a drive of an installation, for example a conveyor belt or a fan, is an indication of an undesired sluggishness or blockage of the installation. In this way, status monitoring an installation component driven by the electric motor can also take place by status monitoring a current-carrying electrical component, for example an electric motor.

Based upon a time series of the difference, information regarding the status of the corresponding current-carrying electrical component and/or the electrical stress of the current-carrying component, for example of a switch such as a contactor and/or an electric motor and/or an installation driven in an electromotive manner such as a fan or a conveyor belt, can therefore be determined. In this way, the remaining lifespan of the current-carrying electrical component or an installation component driven by the current-carrying electrical component can be calculated, for example. This makes it possible to carry out maintenance on the current-carrying electrical component or the installation component in a timely manner before excessive wear of the current-carrying electrical component or the installation component and therefore to preempt undesired failure of the current-carrying electrical component or the installation component and as a consequence costly installation downtime, for example.

The outlined object definition is also achieved by a control and measuring device according to an embodiment of the invention. In this case, the control and measuring device has a sensor for detecting measured values of an electrical variable in a current feed line before and after the switching process in one or a plurality of current supply lines, wherein electrical current is carried to two or more current-carrying electrical components from an electrical energy source via the common current feed line and from the common current feed line in each case via a separate current supply line which can be switched individually, i.e. opened or closed. And the control and measuring device has a processor for calculating a difference between a measured value detected before the switching process and a measured value detected after the switching process and for determining a status change of at least one of the two or more components based upon a time series of the difference.

The control and measuring device can be characterized as follows: a processor controls switching devices which open and close current flows in a current distribution device. Measured values which are acquired in the current distribution device by one or a plurality of sensors relating to the current flows are supplied to the processor. Neither the data flow between the sensor and the processor nor between the processor and the switching devices for switching, i.e. opening and closing, the current flow in the current supply lines takes place via a data bus. In order to calculate the state of wear of a current-carrying electrical component and/or of an installation component driven by the current-carrying electrical component, the current time profile and/or the voltage time profile is detected and evaluated directly after switching on and/or off a current flow to the current-carrying electrical component.

One particular advantage of an embodiment of the invention is that a control and measuring device, which has a sensor, i.e. a measured value detection device, and a processor, detects and preferably for the most part already processes or preprocesses measured values of at least one electrical variable in relation to a plurality of instead of merely one current-carrying electrical component; the costs for the control and measuring device are thus spread over a plurality of current-carrying electrical components, and the costs per current-carrying electrical component are lower than if each current-carrying electrical component were monitored individually by a separate control and measuring device. The more current-carrying electrical components, combined in a current distribution device, which are monitored by one individual control and measuring device, the lower the costs. An embodiment of the invention therefore reduces the use of monitoring components for detecting electrical data in technical installations and thus reduces the costs incurred for a status monitoring.

The control and measuring device has a processor for running a program for carrying out the method according to an embodiment of the invention. In addition, the control and measuring device has a measured value detection unit, i.e. a sensor, for voltage and/or current monitoring a single-phase or multiphase current line which is placed in the current feed line which is provided for all current-carrying electrical components, for example electrical consumers, present in the current distribution device. Via intelligent switching of the current-carrying electrical components, a "footprint" can be created in the control and measuring device for each of the current-carrying electrical components. Over the life cycle, changes to the "footprint" can serve as a trigger for targeted preventive maintenance of the individual current-carrying electrical components or the installation components driven by them.

One distinctive feature of an embodiment of the invention is that a sensor which is suitable for measuring current and/or voltage is introduced for the consumers in a current feed line, which is common to two or more consumers, of a current distribution device, coupled with a processor with a preferably high measured value. The sensor is directly connected, i.e. not via a possibly time-delaying data bus, to the processor, which also controls switching devices for switching the current supply lines leading from the common current feed line to the consumers, i.e. switches on and off. The switching devices are therefore also directly controlled by the processor, i.e. not via a possibly time-delaying data bus.

According to a preferred configuration of an embodiment of the invention, the control and measuring device has a storage device, i.e. a data storage device, i.e. a data storage device is assigned to the processor, in which data storage device the measured values acquired by the sensor can be temporarily stored. In this way, a data buffer for temporary storage is available to the control and measuring device, so that transmission of the measured values to a superordinate control system can be delayed and can take place at a later point in time, then possibly as a larger data set comprising a plurality of measured values.

The storage device of the control and measuring device can therefore be provided with a separate device component or can be integrated into a different device component. Owing to its function as an intermediate buffer, the data storage device of the control and measuring device makes it possible to use a data bus for transmitting optionally preprocessed measured values to a superordinate control system, which data bus only allows a data transmission at specified bus cycle times. Furthermore, measured values detected by the sensor can be preprocessed by the processor and temporarily stored in the storage device as an intermediate result until the intermediate result, which preferably has a significantly lower data volume relative to the original measured values, is transmitted to a superordinate control system at a later point in time. The storage device can be designed in the form of a semiconductor storage device, for example.

According to a preferred configuration of an embodiment of the invention, the control and measuring device has a communication interface for transmitting detected measured values into a communication network. The communication interface, for example in the form of an interface unit, is used for the processor to communicate with a communication network, for example via a data bus system. The communication between the processor and the communication network via the communication interface does not have to take place after each input, into the processor, of a measured value detected by the sensor or before each output, from the processor, of a control command for controlling a switching device, arranged in a current supply line, for opening or closing the corresponding current supply line, but rather in blocks after a specified cycle time or according to a specified algorithm, after an error event is determined. An error event is understood as an indication of a status change, for example as a result of incipient wear, of a component, wherein the indication is present in the form of a changing time series of the difference. If an error event occurs, a message can be communicated via a data line, for example a data bus, to a superordinate control system which is preferably arranged in the communication network. A bus response time of a data bus thus has no influence on data processing in relation to a current-carrying electrical component.

The individual footprints of the consumer are determined by differential current measurement and are stored in the control and measuring device, in particular a storage device of the control and measuring device. It is also possible that a footprint which has been detected at an earlier point in time, for example during a test in the manufacturer's quality control, during a functionality test of the consumer performed by the manufacturer before delivery to an operator of the consumer, or directly after starting up the consumer in the case of an operator of the consumer, is stored in a storage device so that it may be used as a reference in a comparison with measured values of the consumer which are determined later. Footprints of this type can be saved in a storage device attached to the consumer, for example, from which storage device they can be uploaded to the control and measuring device. Footprints of this type can also be downloaded, for example, via a communication interface of the control and measuring device from a publicly accessible storage device, for example a website of the manufacturer of the consumer. It is also possible that a footprint of this type which serves as a reference is manually input into a storage device by transmitting values characterizing the consumer, for example a nominal current, using data sheets, manufacturer specifications, handbooks, reference works, etc.

The determination of footprints takes place continuously over the life cycle of a consumer. Each determined footprint is compared with a previous, stored footprint. If a deviation is determined, a servicing can be carried out in a targeted manner for this consumer. If a deviation of a current footprint from a footprint stored previously is identified, for example, this deviation can be interpreted a) by an analysis software in the control and measuring device or b) by a superordinate control system in the communication network. In the first case, the analyzed result can be transmitted via a data line, for example a data bus, to a superordinate control system in the communication network. In the second case, it is possible that only data deviating from the stored footprint are determined in the control and measuring device (pre-processing) and these deviations are transmitted via a data line, for example a data bus, to a superordinate control system; interpretation can then take place in the superordinate control system. Both analysis processes pursue the objective of identifying wear in the consumer at an early stage, in order to be able to carry out maintenance or a servicing. The term analysis software includes analysis firmware.

According to a preferred configuration of an embodiment of the invention, the measured values are detected in a first time frame before and in a second time frame after the switching process in the one or plurality of current supply lines. A time frame is a period with a defined start time and end time, i.e. with a defined duration. In at least one first time frame before the switching process, at least one measured value is detected in the common current feed line. In at least one second time frame after the switching process, at least one measured value is detected in the common current feed line. Difference formation between the measured values detected before and after the switching process determines which changes the detected electrical variable experiences in the current supply lines affected by the switching process. The measured values are detected in the time frames with defined measuring rates, i.e. with a defined number of measurements per time unit. The advantage is that acquiring measured values can be adapted to the respective rate of change of the electrical variables to be detected or to a time interval in which statements regarding the component of interest can be best achieved: a time frame is preferably opened in a temporal range where the measured values allow statements regarding a respective component, for example an electric motor, a switching device or an application such as a conveyor belt.

According to a preferred configuration of an embodiment of the invention, the setting of the parameters of the time frames is selected depending on the application in which the two or more current-carrying electrical components are operated. The advantage is that the acquisition of measured values can be individually adapted to the respective rate of change of the electrical variables to be detected in relation to the application. For example, the switch-on rush can only be measured directly after switching on an electric motor; a corresponding time frame must therefore begin directly at the switch-on time, have a high measuring rate and may already end again after a few milliseconds, as soon as the switch-on rush ends. On the other hand, it is not necessary to set the time frame over the switch-on rush of the electric motor for status monitoring a bearing of a mechanical application operated by an electric motor; it is more appropriate here to allow the time frame to begin at a later point in time, when the electric motor has reached a steady state, where a slightly increased current strength can infer a continuous increased load of the electric motor as a result of the worn bearing.

According to a preferred configuration of an embodiment of the invention, parameters of the time frames can be set. Parameters of the time frames are in particular the length of the time frames, i.e. the temporal distance of the start times and end times of the time frames, and the temporal distance of the time frames to a point in time of the switching process, for example to a start time of the switching process or a point in time at which a control command for starting the switching process is sent from the control and measuring device to a switching device. The measuring rates in the time frames are also parameters of the time frames. The advantage is that the acquisition of measured values can be adapted to the respective rate of change of the electrical variables to be detected or to a time interval in which statements regarding the components of interest can be best achieved.

According to a preferred configuration of an embodiment of the invention, the parameters of the time frames are stored in a storage device depending on the application. A table can be stored in the storage device, for example, in which table parameters of time frames which are suitable for status monitoring the respective consumer and/or the respective applications are stored for different consumers and applications. The operation of a specific application can require switching different consumers according to an operating plan at defined points in time, for example the operation of a conveyor system with a plurality of electric motors which drive conveyor belts. This operating plan which controls a plurality of consumers, here: electric motors, may now have one or a plurality of suitable points in time and time intervals at which measured values are to be detected if information regarding a status of a specific consumer, for example a switching device, an electric motor, or an application driven by the electric motor, is to be acquired. The advantage is that status monitoring in a system with a plurality of consumers is greatly simplified, since for status monitoring any consumer which is supplied with current via a current distribution line, only predefined values from the table are extracted and must be used as a basis for the measurement.

According to a preferred configuration of an embodiment of the invention, the processor controls the switching devices assigned to it with a time offset. After opening or closing a current supply line to a current-carrying electrical component, a certain time span elapses until the current-carrying electrical component or the current flow in the current-carrying electrical component has returned to a steady state. For example, the so-called switch-on rush occurs, i.e. a strongly increased switch-on current, when switching on an electric motor. If a second electric motor supplied via a second current supply line were already switched on during the switch-on rush of a first electric motor supplied via a first current supply line, the current curves of both electric motors would overlap during their respective switch-on rush and it would be impossible to assign a current profile deviating from a reference current profile and indicating wear of an electric motor to one of the two electric motors.

The processor therefore controls the switching devices assigned to it with a temporal offset in such a way that the current profile of interest of a first current-carrying electrical component ends before the current profile of interest of a second current-carrying electrical component is introduced. In this way, a clear determination of the power data or electrical data of an individual consumer is ensured via current differential measurement. The time offset is selected to be sufficiently large so that a clear assignability of measured current values to a current-carrying electrical component is ensured. Otherwise, the time offset is selected to be sufficiently small so that the switch-on times are perceived as practically simultaneous during real operation. In other words: the method according to an embodiment of the invention can be performed without disturbing operation of an installation. In this case, a second switching time for switching on a second current-carrying electrical component can take place with a delay of 25 ms, for example, after a first switching time for switching on a first current-carrying electrical component.

According to a preferred configuration of an embodiment of the invention, detecting measured values of an electrical variable in the common current feed line takes place with a frequency in the range of 100 to 10,000 measurements per second. The advantage is that even rapidly occurring processes such as a switch-on rush can be detected with such a high temporal resolution that a sufficiently large number of measured values are present for a detailed differential value formation.

It is possible that time frames of differing length are defined in which measured values at the common current feed line are detected by the sensor. A first time frame can be defined before and a second time frame after a switching time of a switching device arranged in a current supply line. In this case, the time frame can have a length of 5 ms, for example, for monitoring the current profile after a first switching time for switching on a first electric motor. Within a time frame, the sensor can detect measured values with a period of 0.1 ms, for example. A time frame which is 5 ms long for monitoring the current profile after switching on an electric motor would thus result in fifty measured values. These fifty measured values define a "footprint" of the electric motor.

According to a preferred configuration of an embodiment of the invention, after every control command to a contactor, the processor determines the difference of the new values relative to the values which were measured before the control command. This preprocessing of the measured values in the processor reduces the amount of data which, for data analysis, have to be transmitted to a processor for processing the measured values.

According to a preferred configuration of an embodiment of the invention, the differential values calculated in this way are temporarily stored, processed by the processor, or transmitted via a communication interface to a processor for processing the measured values, preferably a superordinate control system. Owing to temporary storage, data transmission can be ensured despite a cycle time of a data bus. It is possible that there are better analysis possibilities in a communication network, for example in a cloud-based IoT platform such as Mindsphere®, than in a processor operating in isolation.

According to a preferred configuration of an embodiment of the invention, a transmission of detected measured values from a sensor for detecting the measured values to the processor, preferably for processing the measured values, takes place via an unclocked direct communication link. An arrangement without a data bus is important in order to obtain reproducible time frames in which the differential values are determined.

According to a preferred configuration of an embodiment of the invention, information regarding the status of the corresponding electrical consumer and/or the electrical stress of the switching device or also the consumer can be determined in the further processing of the differential values. In this way, the remaining lifespan of a contactor can be calculated, for example. This makes it possible to carry out a servicing in a timely manner before wear and therefore to prevent a longer installation downtime.

According to a preferred configuration of an embodiment of the invention, further analyses of a consumer branch are carried out with an analysis software. In this case, the costs for the hardware remain very limited.

In the case of an electromechanically actuated switching device, for example a contactor, the main contacts of which switch a three-phase current, the load of the switch contacts is dependent on the exact point in time at which the contacts open or close. The electrical load of the contacts and thus also their erosion as a result of the electric arc which occurs when opening or closing is substantially dependent on the phase of the network voltages or network currents present at the point in time of the contact opening or the contact closing. If a three-phase system, for example a three-phase motor is switched with the switching device, and if the electromechanical drive is operated with a direct voltage, which is switched on and off at random, this results in an equal distribution of the switching angles for each of the contacts, i.e. each phase position occurs with equal frequency for each contact. This results in an equal erosion for all of the contacts of the switching device, since each contact experiences the same combination of switching processes with low and high erosion.

If the drive of the switching device is operated with alternating voltage or with a rectified alternating voltage, the sequences of the closing and opening processes are additionally dependent on which phase position the supply voltage of the electromechanical drive has at the time of its actuation. In practice, even if the phase position of the supply voltage of the drive is equally distributed, very different frequencies in the phase of the load voltage or load currents are observed for each of the three main contacts when the drive is switched on and off. This effect is also referred to as self-synchronization.

In addition to this self-synchronization, in practice, an external synchronization is also often observed, in the case of which already an unequally distributed phase position of the supply voltage causes a synchronization of the switching processes when the drive is switched on or off. An external synchronization of this type can also be caused by an electronic control system if dependencies to the phase position of the network arise in the temporal sequence between a switching command and switching on and off the supply voltage of the drive. In extreme cases, only one predetermined switching angle occurs.

According to a preferred configuration of an embodiment of the invention, a synchronization effect is detected in a multiphase three-phase current by evaluating the current strength in the individual current paths, i.e. the respective conductor for one of the plurality of current phases, and in response to this, the switching delay between the current paths is changed in such a way that the contacts wear evenly in the switching device. In this case, the advantage is that the electrical lifespan of the switching device can be as far as doubled relative to that of a switching device without a change in the switching delay. With regard to known methods for preventing the synchronization effect, reference is made to DE 19948551 C1 (Siemens AG) 05.07.2001 and DE 102005043895 B4 (Siemens AG) 15.03.2007, the entire contents of each of which are hereby incorporated herein by reference.

The outlined object definition is also achieved by a computer program product according to an embodiment of the invention. A computer program product (80) for status monitoring at least one of two or more current-carrying electrical components (18.1, 18.2, 18.3, 41, 42, 43), wherein the computer program product (80) can be executed in a processor (6) of a control and measuring device (3). The computer program product is designed to be executable in at least one processor of the control and measuring device. The computer program product can be designed as software, for example as an app which can be downloaded from the internet, or as firmware which can be stored in a storage device of the control and measuring device and can be executed by the processor or a computer unit. Alternatively or additionally, the computer program product can also be designed at least partially as a hard-wired circuit, for example as an ASIC (ASIC=Application-Specific Integrated Circuit).

The computer program product according to an embodiment of the invention is designed to perform the method as claimed in one of the abovementioned claims. The computer program product is therefore designed to perform the method for status monitoring at least one of two or more current-carrying electrical components. In particular, it is designed to perform the step of detecting measured values of an electrical variable in the common current feed line before and after a switching process in one or a plurality of the current supply lines. Furthermore, it is designed to carry out the step of calculating a difference between a measured value detected before the switching process and a measured value detected after the switching process. Moreover, it is designed to carry out the step of determining a status change of at least one of the two or more components based upon a time series of the difference.

According to an embodiment of the invention, the computer program product is designed to implement and perform at least one embodiment of the outlined method for status monitoring. In this case, the computer program product can combine all sub-functions of the method, i.e. can be designed monolithically. Alternatively, the computer program product can also be designed in a segmented manner and in each case distribute sub-functions to segments which are executed on separate hardware. In this way, the computer program product can be designed to be executable partially in a control unit of the sensor and partially in a control unit of the control module. Furthermore, a part of the method can be performed in the control and measuring device and another part of the method in a control unit which is superordinate to the control and measuring device, such as an SPC, a manual parameterization device or a computer cloud, for example.

The above-described properties, features and advantages of this invention as well as the manner in which they are achieved become clearer and more understandable in the context of the subsequent description of the example embodiments, which are explained in greater detail in connection with the drawings. In this case, in schematic representation:

An embodiment of the present invention relates to—generally speaking—an electrotechnical set of facts. Terms such as "connected" and "disconnected" or "insulated" and the like are therefore always meant in the electrical sense, not in the mechanical sense.

FIG. 1 shows a current distribution device 2 which carries electrical current from an electricity network 14 to three electric motors 41, 42, 43 as current-carrying electrical components. The three electric motors 41, 42, 43 are in each case used as drives for installations which are not represented, for example fans, conveyor belts or agitators. The current line from the electricity network 14 to the current distribution device 2 takes place via a common current feed line 20. The current distribution device 2 has a sensor 4 for detecting an electrical variable in the common current feed line 20. The current line from the common current feed line 20 to the three electric motors 41, 42, 43 takes place in each case via one of three separate current supply lines 28.1, 28.2, 28.3. For each of the separate current supply lines 28.1, 28.2, 28.3, the current distribution device 2 has a power switch 16.1, 16.2, 16.3 and a switching device 18.1, 18.2, 18.3 which is downstream of the respective power switch 16.1, 16.2, 16.3 in the current direction.

The switching devices 18.1, 18.2, 18.3 are used for switching, i.e. opening or closing, the current supply line 28.1, 28.2, 28.3 assigned to the switching devices 18.1, 18.2, 18.3 in each case. The power switches 16.1, 16.2, 16.3 are used to protect the downstream components, i.e. the current supply lines 28.1, 28.2, 28.3, the switching devices 18.1, 18.2, 18.3 as well as the electric motors 41, 42, 43 from damaging short-circuit currents and overload currents.

The current distribution device 2 also has a control and measuring device 3 which has a sensor 4 and a control module 5. The control module 5 has a processor 6 by way of which the switching devices 18.1, 18.2, 18.3 can be controlled, for example can be triggered to open or close the current supply line 28.1, 28.2, 28.3. For this purpose, each of the switching devices 18.1, 18.2, 18.3 is connected to the processor 6 via a corresponding control line 26.1, 26.2, 26.3. In this case, the connection between the processor 6 and each of the switching devices 18.1, 18.2, 18.3 is not realized via a data bus but rather via a direct connection without time delay.

The processor 6 is also connected to the sensor 4, which is arranged on the common current feed line 20, via a sensor data line 24. As a result, measured values detected by the sensor 4 can be transmitted to the processor 6. In this case, the connection between the sensor 4 and the processor 6 is not realized via a data bus but rather via a direct connection without time delay.

The control module 5 also has a communication interface 8 which is designed as an interface module and which is connected to the processor 6 via a communication link 30. Via the communication interface 8, the current distribution device 2 can be connected to a communication network 12. For example, the processor 6 can send measured values obtained by the sensor 4, optionally after the processor has preprocessed the measured values, for example for reducing the data volume, via the communication interface 8 into the communication network 12, where, for example, the measured values may be subject to a detailed analysis, for example via automatic predictive and prescriptive processes. For this purpose, the communication network 12 can have programs for analyzing measured values, for example in the form of a cloud-based IoT platform such as Mindsphere®. The communication network 12 can also have a superordinate control system for the current distribution device 2 which transmits control commands to the processor 6 via the data line 22 based upon the analysis of the measured values run in the communication network 12, which control commands are converted by the processor 6 into corresponding control signals to the switching devices 18.1, 18.2, 18.3.

The control module 5 also has a storage device 10 for data storage which is connected to the processor 6 via a communication link 32. Measured values which are transmitted from the sensor 4 to the processor 6 can be temporarily stored in the storage device 10, for example until a suitable point in time has arrived for transmitting the measured values from the current distribution device 2 into the communication network 12.

A computer program product for carrying out the method for status monitoring at least one of two or more current-carrying electrical components is saved in the storage device 10 and is executed in the processor 6 of a control and measuring device 3. If the computer program product is run in the processor 6, the steps of detecting measured values of an electrical variable in the common current feed line 20 before and after a switching process in one or a plurality of the current supply lines 28.1, 28.2, 28.3; calculating a difference between a measured value detected before the switching process and a measured value detected after the switching process; and determining a status change of at least one of the two or more components 18.1, 18.2, 18.3, 41, 42, 43 based upon a time series of the difference are performed.

Figure 2:
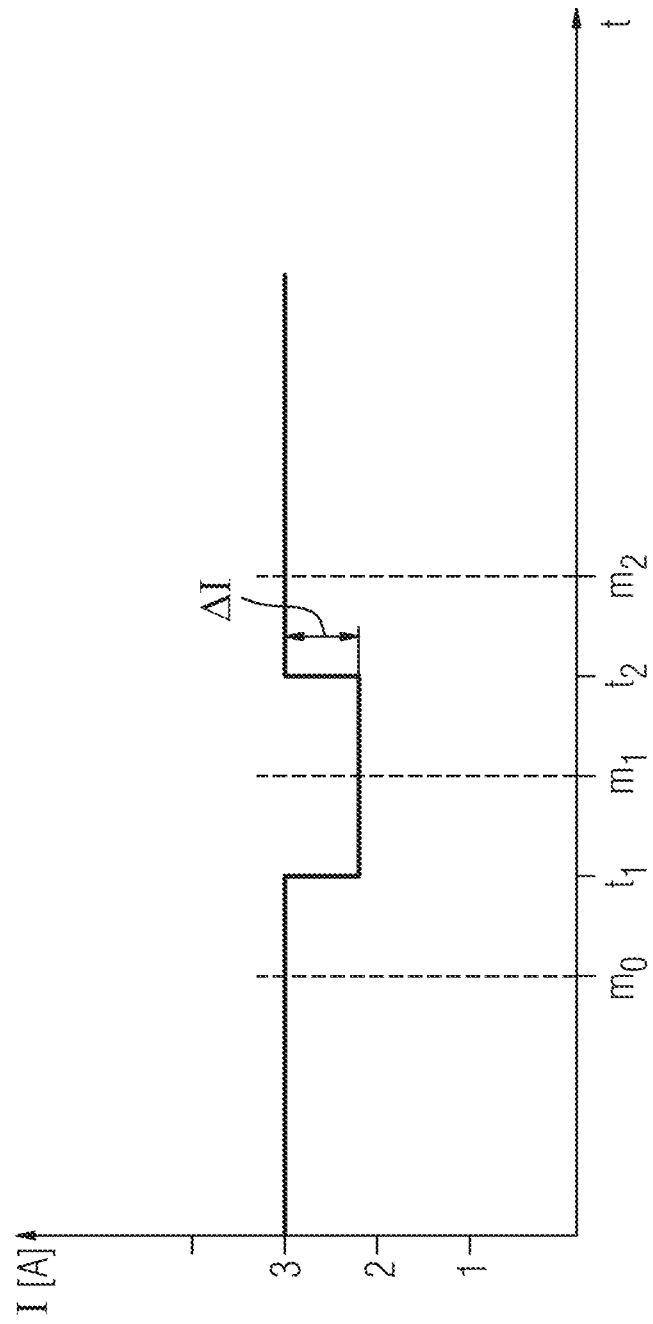
FIG. 2 shows a current profile in a common current feed line during a switching-off and switching-on process.

FIG. 2 shows a temporal profile of the current strength I measured in a common current feed line 20 in the unit of ampere. At the points in time m0, m1 and m2, the sensor 4 detects measured values of the current strength. At the point in time t1, one of the three current supply lines 28.1, 28.2, 28.3 is opened, i.e. switched to block current, whereby the current strength I in the common current feed line 20 decreases by an amount ΔI. At the point in time t2, the one opened current supply line 28.1, 28.2, 28.3 is closed again, i.e. switched to conduct current, whereafter the current strength I in the current feed line 20 increases to its original value again. This example of a switching process illustrates the method according to an embodiment of the invention: interrupting or restoring the current flow in one or a plurality of the current supply lines 28.1, 28.2, 28.3 results in a change of an electrical variable, here: the current strength, in the common current feed line 20, which, detected and evaluated, allows conclusions regarding the current profile in the individual current supply lines 28.1, 28.2, 28.3 and thus regarding the status of current-carrying electrical components which are supplied with electrical energy via the current supply lines 28.1, 28.2, 28.3.

Figure 3:
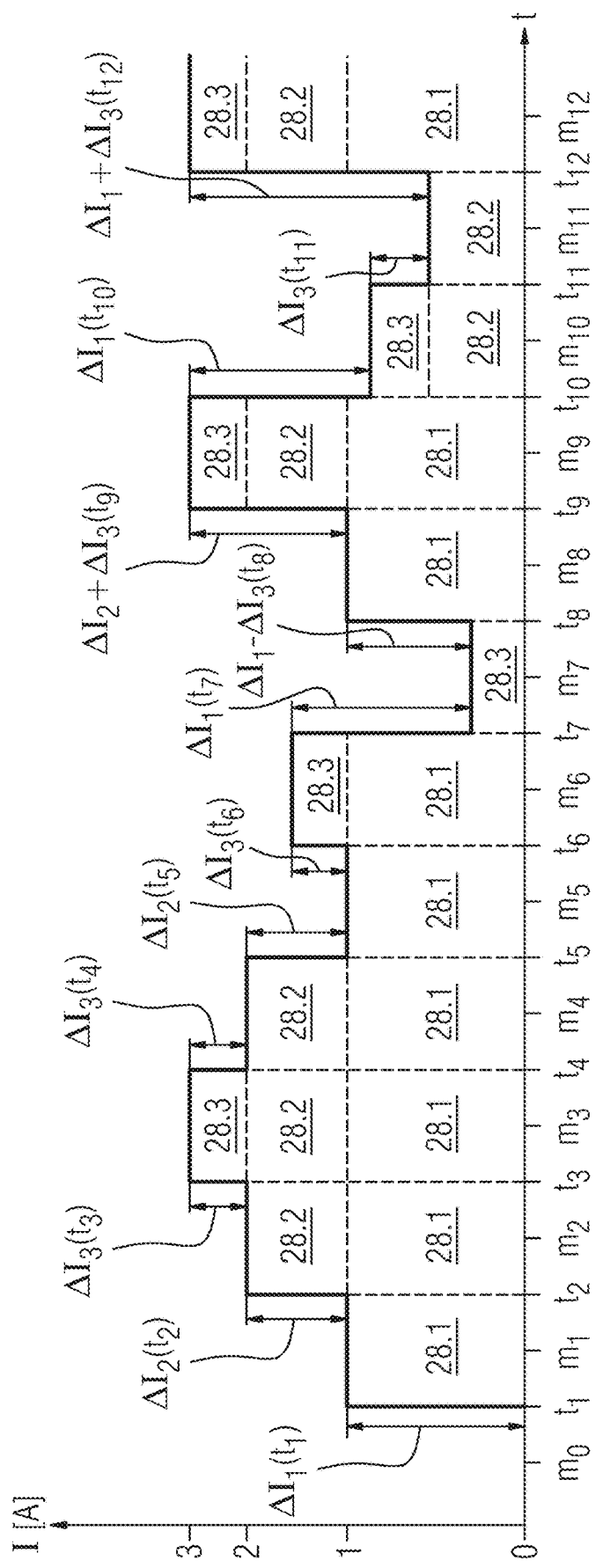
FIG. 3 shows a current profile in a common current feed line for an industrial switching cycle in the case of a properly operating installation.

FIG. 3 shows a temporal profile of the current strength I measured in the common current feed line 20 of the current distribution device 2 represented in FIG. 1 in any unit for an industrial switching cycle in the case of a properly operating installation, comprising three electric motors 41, 42, 43 with different power. For example, the three electric motors 41, 42, 43 drive conveyor belts of different lengths of a conveyor system, wherein the switching cycle specified by a control system ensures proper conveyance of goods via the conveyor system. At the points in time m0 to m12, the sensor 4 in each case detects measured values of the current strength in the common current feed line 20.

At the point in time t1, a first current supply line 28.1 which supplies the first electric motor 41 with electrical energy is switched to conduct current, i.e. closed, by closing the contacts of the first switching device 18.1, whereby the current strength I in the common current feed line 20 increases by an amount ΔI1(t1). It should be noted that ΔIx(ty) is a simplified notation for ΔI28.x(ty), wherein this simplified notation is used for all current differential values occurring in this description. At the point in time t2, a second current supply line 28.2 which supplies the second electric motor 42 with electrical energy is additionally switched to conduct current, i.e. closed, by closing the contacts of the second switching device 18.2, whereby the current strength I in the common current feed line 20 increases by an amount ΔI2(t2). At the point in time t3, a third current supply line 28.3 which supplies the third electric motor 43 with electrical energy is additionally switched to conduct current, i.e. closed, by closing the contacts of the third switching device 18.3, whereby the current strength I in the common current feed line 20 increases by an amount ΔI3(t3). At the time of measurement m3, the current strength I detected by the sensor 4 in the common current feed line 20 is therefore at a value which corresponds to the sum ΔI1(t1)+ΔI2(t2)+ΔΔI3 (t3).

At the point in time t4, the third current supply line 28.3 is switched to block current, i.e. opened, by opening the contacts of the third switching device 18.3, whereby the current strength I in the common current feed line 20 decreases by an amount ΔI3(t4). At the point in time t5, the second current supply line 28.2 is switched to block current, i.e. opened, by opening the contacts of the second switching device 18.2, whereby the current strength I in the common current feed line 20 decreases by an amount ΔI2(t5). At the point in time t6, the third current supply line 28.3 is switched to conduct current, i.e. closed, by closing the contacts of the third switching device 18.3, whereby the current strength I in the common current feed line 20 increases by an amount ΔI3 (t6).

At the point in time t7, the first current supply line 28.1 is switched to block current, i.e. opened, by opening the contacts of the first switching device 18.1, whereby the current strength I in the common current feed line 20 decreases by an amount ΔI1(t7), to a value which corresponds to the current flow in the third current supply line 28.3.

At the point in time t8, the third current supply line 28.3 is switched to block current, i.e. opened, by opening the contacts of the third switching device 18.3, and at the same time the first current supply line 28.1 is switched to conduct current, i.e. closed, by closing the contacts of the first switching device 18.1, whereby the current strength I in the common current feed line 20 increases by an amount ΔI1-ΔI3(t8), to a value which corresponds to the current flow in the first current supply line 28.1.

At the point in time t9, the second current supply line 28.2 is switched to conduct current, i.e. closed, by closing the contacts of the second switching device 18.2, and at the same time the third current supply line 28.3 is switched to conduct current, i.e. closed, by closing the contacts of the third switching device 18.3, whereby the current strength I in the common current feed line 20 increases by an amount ΔI2+ΔI3(t9).

At the point in time t10, the first current supply line 28.1 is switched to block current, i.e. opened, by opening the contacts of the first switching device 18.1, whereby the current strength I in the common current feed line 20 decreases by an amount ΔI1 (t10), to a value which corresponds to the sum of the current flows in the second current supply line 28.2 and the third current supply line 28.3.

At the point in time t11, the third current supply line 28.3 is switched to block current, i.e. opened, by opening the contacts of the third switching device 18.3, whereby the current strength I in the common current feed line 20 decreases by an amount ΔI3(t11).

At the point in time t12, the first current supply line 28.1 is switched to conduct current, i.e. closed, by closing the contacts of the first switching device 18.1, and at the same time the third current supply line 28.3 by closing the contacts of the third switching device 18.3, whereby the current strength I in the common current feed line 20 increases by an amount ΔI1+ΔI3(t12).

Figure 4:
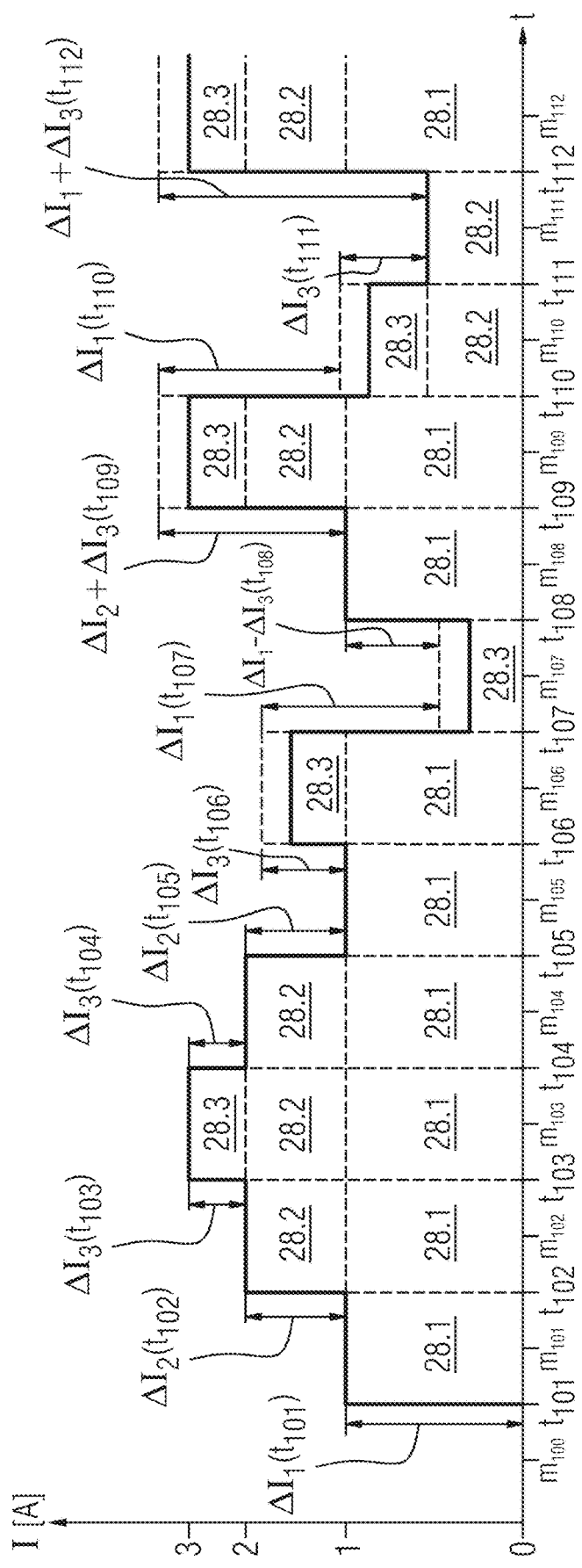
FIG. 4 shows the current profile from FIG. 3 in the case of a defect in the installation.

FIG. 4 shows the current profile from FIG. 3, wherein from the point in time m106, as can be identified from the status or the behavior of the third electric motor 43, a defect in the installation is present. While at the point in time m103 a status change of the third electric motor 43 cannot be identified yet based upon the current strength in the third current supply line 28.3, at the subsequent times of measurement m106 and m111, before which the third electric motor 43 was switched on or off, an increased current strength in the third current supply line 28.3 which leads to the third electric motor 43 in comparison to the point in time m103 can be derived from the measured values acquired in the common current feed line 20: $\Delta I3(t106) > \Delta I3(t103)$ and $\Delta I3(t111) > \Delta I3(t103)$. It can be inferred therefrom that the third electric motor 43 must work against an increased load, for example as a result of jamming in the conveyor belt driven by the electric motor 43.

Alternatively, the measurements can also be evaluated after the switching times t107 and t108: from $\Delta I1(t107) = \Delta I1(t101)$ and $\Delta I1 - \Delta I3(t108) \neq \Delta I1(t101) - \Delta I3(t103)$ it follows that the third electric motor 43 must work against an increased load, i.e. that there is a defect in the branch supplied via the third current supply line 28.3.

Figure 5:
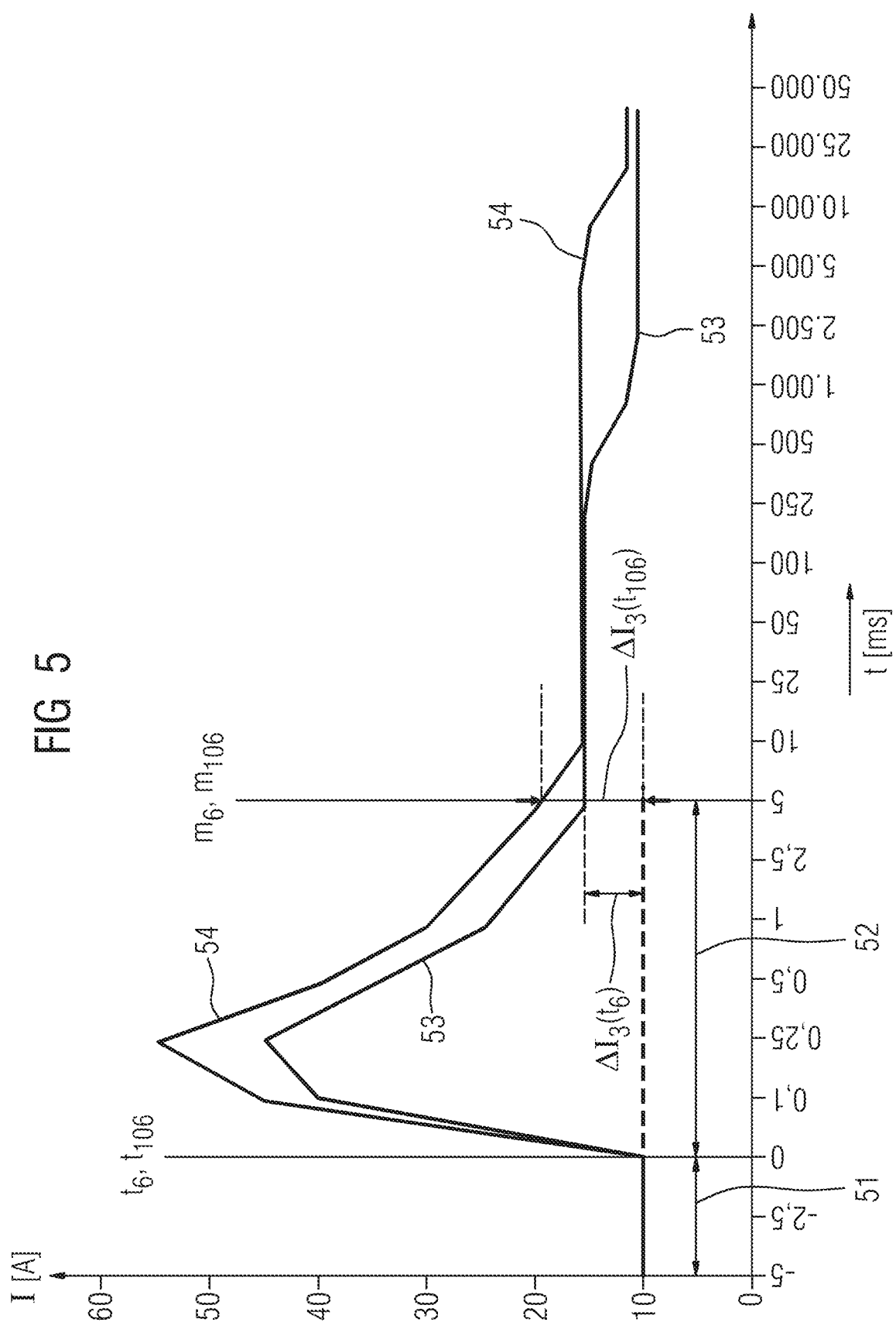
FIG. 5 shows current profiles in a common current feed line when switching on an electric motor.

FIG. 5 shows, in great detail, a current profile 53 in the common current feed line 20 when switching on the third electric motor 43 at the point in time t6, as represented in FIG. 3, and a current profile 54 in the common current feed line 20 when switching on the third electric motor 43 at the point in time t106, as represented in FIG. 4, as a plotting of the current strength I in the unit of ampere over time t in the unit of milliseconds. The zero point of the time axis t is at the switch-on times t6, t106, wherein the plotting of the time values to the left of the zero point is linear, whereas the plotting of the time values to the right of the zero point, for a more precise representation of the current profiles 53, 54, is on a logarithmic scale. The current profiles 53, 54 form the "footprint" of the third electric motor 43, wherein the lower current profile 53 of the electric motor 43 was recorded at an earlier point in time, for example during a functionality test of the electric motor 43 performed by the manufacturer before delivery to an operator of the electric motor 43 or directly after its start-up in the case of an operator of the electric motor 43, and the higher current profile 54 of the electric motor 43 was recorded at a later point in time, at which there is a clearly identifiable fault. Since at the points in time t6, t106 the third electric motor 43 is switched on along with the first electric motor 41 which is already running, in the common current feed line 20, the current value in the third current supply line 28.3 adds to the current strength of approximately 10 amperes in the first current supply line 28.1.

Before the switching times t6, t106, a first time frame 51 which is 5 ms long is defined in which the sensor 4 detects measured values at high frequency, for example 10,000 Hz, on the common current feed line 20. Furthermore, after the switching times t6, t106, a second time frame 52 which is 5 ms long is defined in which the sensor 4 detects measured values at high frequency, for example 10,000 Hz, on the common current feed line 20.

In both current profiles 53, 54, a switch-on current, the so called "switch-on rush" flows directly after closing the switch contacts of the third switching device 18.3, which switch-on current is a multiple of the nominal current of the electric motor which is set during continuous operation. The second time frame 52 substantially covers the entire course of the switch-on current. It can be clearly identified that the switch-on current in the disturbed state reaches higher values in the entire second time frame 52 than the switch-on current in the original state. In the second time frame 52, the sensor 4 detects measured values with a period of 0.1 ms, for example, on the common current feed line 20.

In FIG. 5, at the end of the second time frame 52, the differential values $\Delta I3(t6)$ or $\Delta I3(t106)$ between in each case a current measured value detected before closing and a current measured value detected after closing, at the times of measurement m6 or m106, are specified. The two differential values $\Delta I3(t6)$ and $\Delta I3(t106)$ form a time series of the difference, from which the increased switch-on current can be identified at the point in time t106, which serves as an indication of a deterioration of the state of the electric motor.

The differential values $\Delta Ix(ty)$ can either be calculated as one measured value at one time of measurement or as an integral of all measured values detected so far in one time frame.

The switch-on current is followed by a start-up phase of the electric motor, until the electric motor has reached its nominal speed and the current strength drops to the nominal current during continuous operation. The current strength in the start-up phase is approximately the same in both states of the electric motor (approximately 6 A), however, in the disturbed state, the electric motor requires significantly longer than in the undisturbed state until it has reached its nominal speed: approximately 5000 ms compared with 250 ms. The nominal current is also different in both states of the electric motor; the nominal current of the electric motor is significantly higher in the disturbed state than in the undisturbed state: approximately 2 A compared with approximately 1 A. The totality of the differences forms the change of the "footprint" of the electric motor. Temporal changes of the difference of the current strength measured at different points in time serve as an indication of a deterioration of the state of the electric motor.

Figure 6:
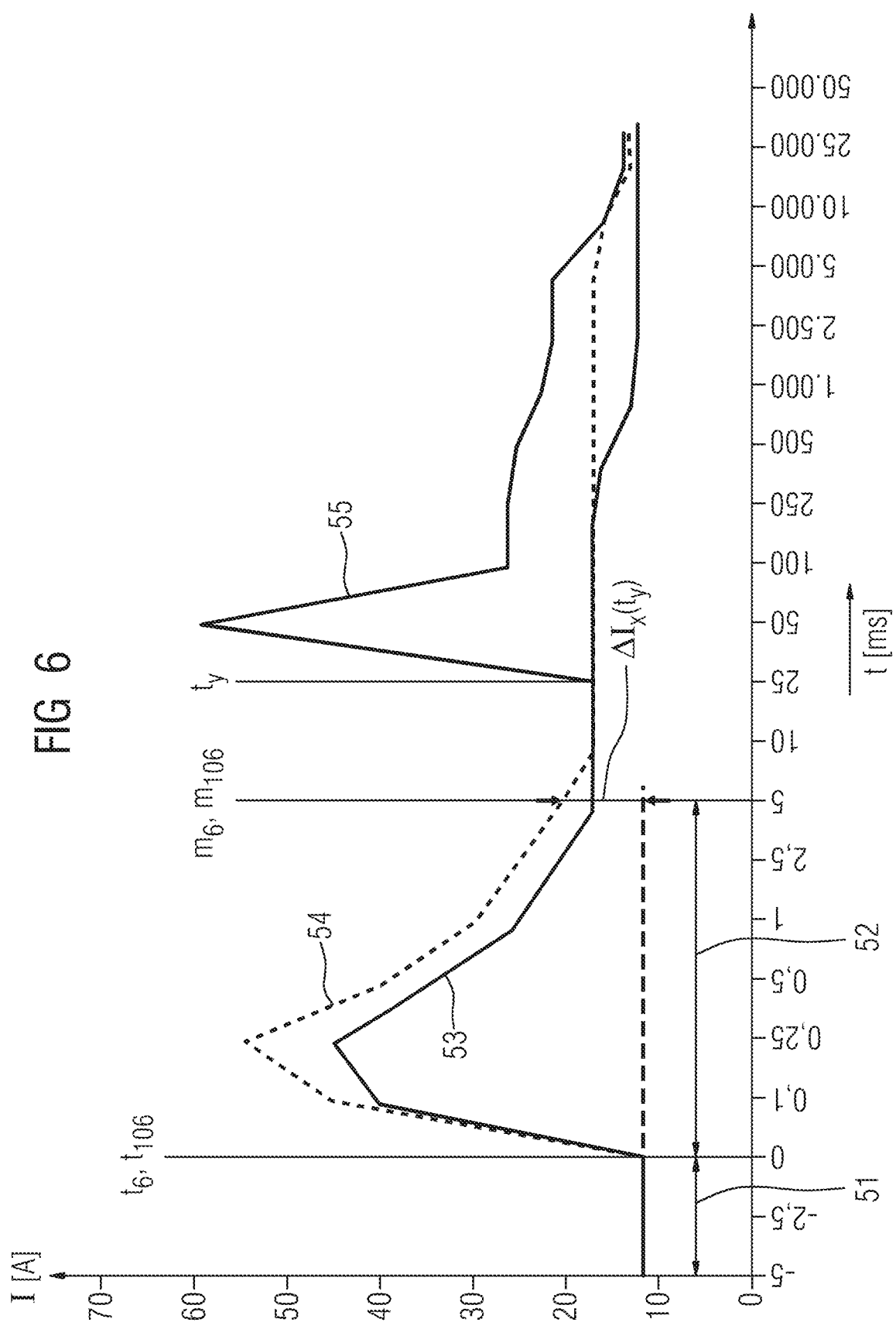
FIG. 6 shows a current profile in a common current feed line when two electric motors are switched on successively.

FIG. 6 is based on FIG. 5 but additionally shows a third current profile 55 in the common current feed line 20 which derives from switching on the second electric motor 42 at a point in time ty=25 ms which follows the point in time t6 or t106. In order not to falsify the current profile 53, 54 of the switch-on current of the third electric motor 43, a length of time is waited with switching on the second electric motor 42 until the switch-on current of the third electric motor 43 has passed into the start-up plateau from t=10 ms. Owing to the time offset of 25 ms between the switch-on time t6, t106 and the switch-on time ty, the current profiles of the switch-on currents 53, 54 and the current profile of the switch-on current 55 do not overlap. The time offset of 25 ms is sufficiently large so that a clear assignability of measured current values to one of the electric motors 42, 43 is ensured. Otherwise, the time offset of 25 ms is sufficiently small so that the switch-on times are perceived as practically simultaneous during real operation. In other words: the method according to an embodiment of the invention can be performed without disturbing operation of an installation.

Figure 7:
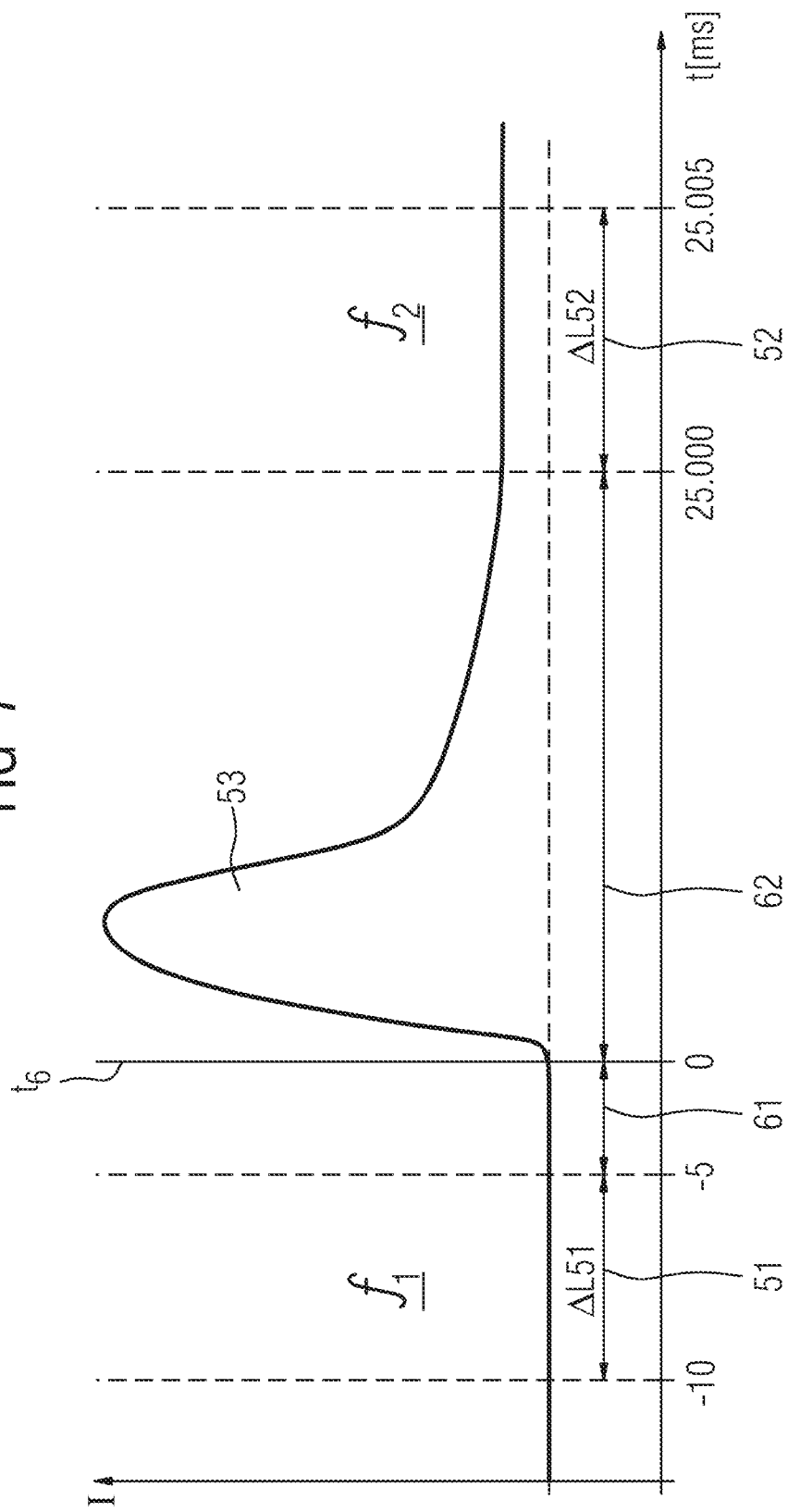
FIG. 7 shows two changeable time frames for measuring a current profile in a common current feed line when switching on an electric motor.

FIG. 7 shows two changeable time frames 51, 52 for measuring a current profile 53, by way of the sensor 4 represented in FIG. 1 in the common current feed line 20 represented in FIG. 1, when switching on an electric motor at the point in time t6, as a plotting of the current strength I over time t in the unit of milliseconds. The zero point of the time axis t is at the switch-on time t6, wherein the plotting of the time values to the left of the zero point is linear, whereas the plotting of the time values to the right of the zero point, for a more precise representation of the current profile 53, is on a logarithmic scale.

Before the switching time t6, a first time frame 51 is defined with the length ΔL51 and a temporal distance 61 from the switching time t6. Within the first time frame 51, which has a length ΔL51 of 5 ms, a sensor 4 detects measured values with a first frequency f1, for example 1000 Hz, on the common current feed line 20. After the switching time t6, a second time frame 52 is defined with the length ΔL52 and a temporal distance 62 from the switching time t6. Within the second time frame 52, which has a length ΔL52 of 5 ms, the sensor 4 detects measured values with a second frequency f2, for example 10,000 Hz, on the common current feed line 20.

Figure 8:
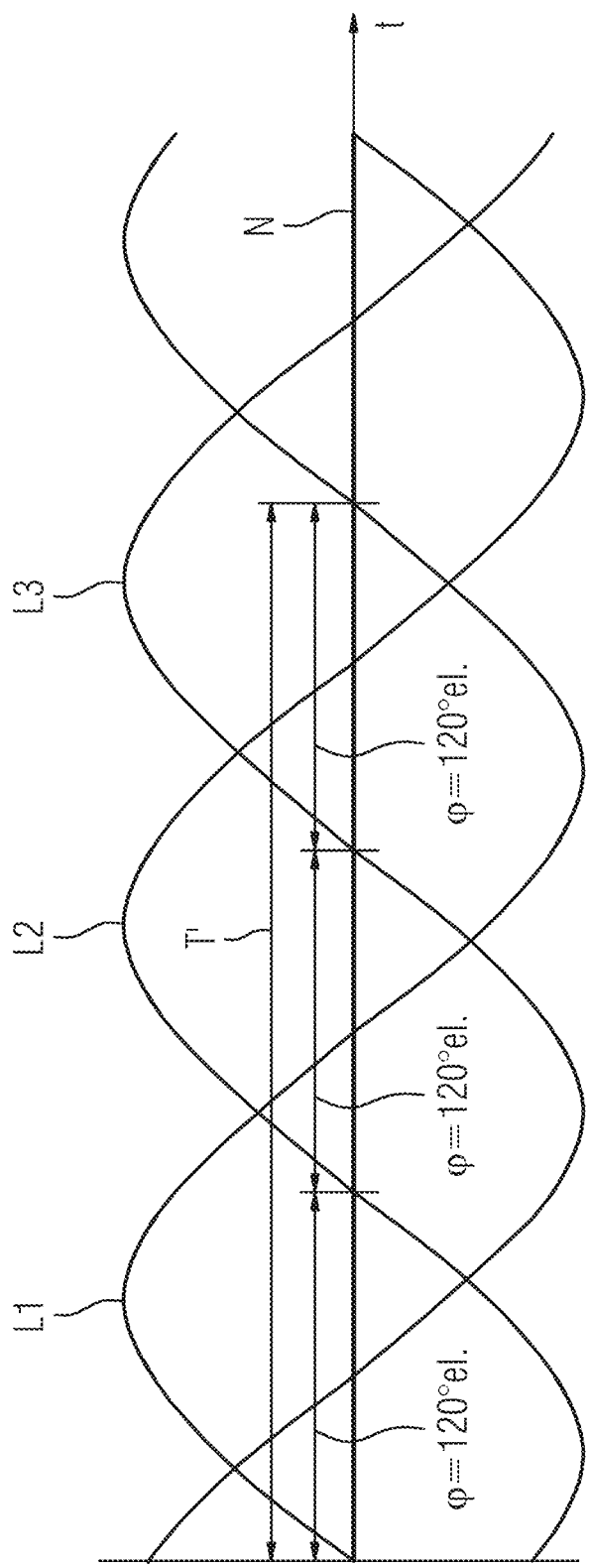
FIG. 8 shows a phase diagram.

FIG. 8 shows a representation of a voltage profile over time in a three-phase three-phase network which, apart from the three phases L1, L2, L3, also has a neutral conductor N. FIG. 8 shows the voltage profiles of the phases L1-L3 relative to the neutral conductor N over time t. According to FIG. 8, the phases L1-L3, relative to one another in an electrical manner, have a phase offset φ of +/−120°, wherein T' is the periods of the three-phase network. The phase offset φ of phase L3 to phase L2, phase L2 to phase L1 and phase L1 to phase L3 is +120° in an electrical manner. The phase offset φ of phase L3 to phase L1, phase L1 to phase L2 and phase L2 to phase L3 is −120° or +240° in an electrical manner. Since the phases L1-L3 are electrically determined only modulo 360°, the phase offset q of phase L3 to phase L1, phase L1 to phase L2 and phase L2 to phase L3 can also be expressed in an electrical manner as +240°.

Figure 9:
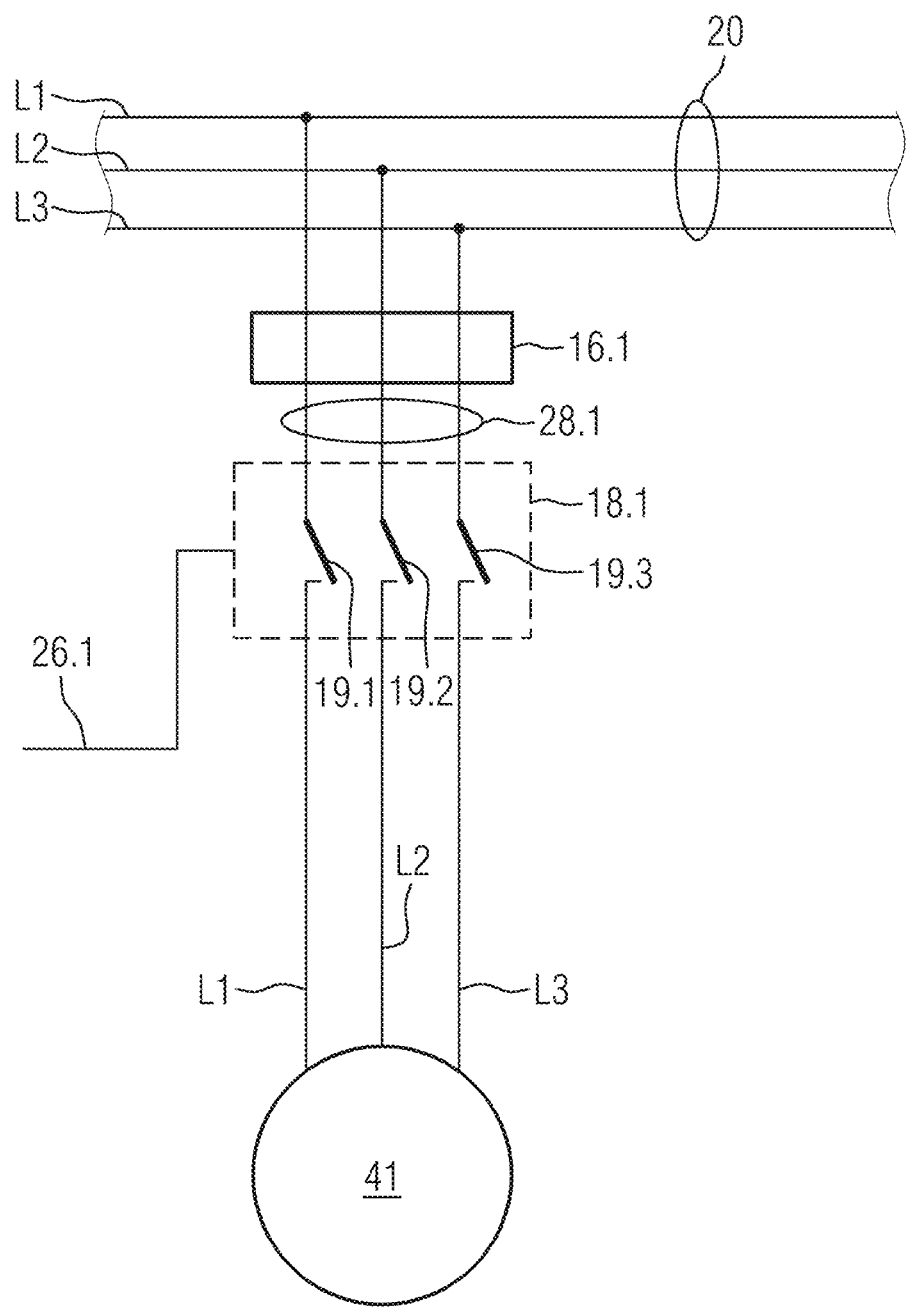
FIG. 9 shows a cut-out from a current distribution device for a 3-phase three-phase network.

FIG. 9 shows an enlarged cut-out from FIG. 1, wherein the current distribution device 2 is configured for a 3-phase three-phase network and the current feed line 20 and the current supply line 28.1 are designed as 3-phase conductors.

According to FIG. 9, the electromagnetic switching device 18.1 is designed as a contactor. It has a contact arrangement with three contacts 19.1, 19.2, 19.3. Via the contacts 19.1, 19.2, 19.3, the electric motor 41 which acts as a three-phase load can be coupled to three phases L1-L3 of a three-phase network or can be decoupled from the three phases L1-L3 if the switching device 18.1 is actuated. When actuating the contact arrangement, i.e. opening or closing the contacts 19.1, 19.2, 19.3, switch erosions occur on the contacts 19.1, 19.2, 19.3 per switching process.

According to aforementioned DE102005043895B4, the entire contents of which are hereby incorporated herein by reference, one possibility for equalizing the switch erosions of the contacts 19.1, 19.2, 19.3 is to wait, after receiving a control signal via the control line 26.1, for a time at which a specified phase position of the supply voltage is reached, and wherein from this point in time there is a delay time until the drive is actuated to open or close the contacts 19.1, 19.2, 19.3.

According to aforementioned DE19948551C1, the entire contents of which are hereby incorporated herein by reference, another possibility for equalizing total erosions of the contact arrangement of the electromagnetic switching device 18.1 with a plurality of contacts 19.1-3 is to determine the respective total erosion for each contact 19.1-3, to supply the total erosions to the processor 6 as a control circuit and to actuate the contact arrangement by way of the processor 6 via the control line 26.1 depending on the determined total erosions in such a way that the total erosions of the contacts 19.1-3 are approximated.

FIG. 10 shows a flow diagram of the disclosed method. The method comprises a first method step 91 in which measured values of at least one electrical variable are detected in the common current feed line 20 before and after opening or closing a current supply line 28.1, 28.2, 28.3. For this purpose, a sensor 4, which is arranged on the common current feed line 20, of the control and measuring device 3, for example a current transformer or a current measuring resistor, can detect measured values of an electrical variable, for example a current strength or a voltage difference, which occur in the common current feed line 20 before and after opening or closing one or a plurality of the current supply lines 28.1, 28.2, 28.3.

The method comprises a second method step 92 which follows the first method step 91 and in which a difference between a measured value detected before opening or closing and a measured value detected after opening or closing is calculated. For this purpose, the processor 6 of the control and measuring device 3 can receive measured values detected by the sensor 4, i.e. a measured value detected before opening or closing and a measured value detected after opening or closing, and can calculate a difference between the measured value detected before opening or closing and the measured value detected after opening or closing therefrom.

The method comprises a third method step 93 which follows the second method step 92 and in which a status change of at least one of the two or more current-carrying electrical components 41, 42, 43 is determined based upon a time series of the difference. For this purpose, the processor 6 of the control and measuring device 3 can compare a differential value ΔI(t1) assigned to a first point in time t1 with at least one differential value assigned to a second t2, third t3, etc. point in time deviating from the first point in time t1 and derive from this a change of a status of at least one of the two or more current-carrying electrical components 41, 42, 43.

By evaluating these measured values in the processor 6, i.e. a comparison of the current values at different points in time, it is determined that the current flow in the third current supply line 28.3 has increased, which indicates a possible fault in the installation component 43, which is supplied with current via the third current supply line 28.3. An operator of the installation component 43 may therefore arrange a technical inspection or maintenance.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112 (f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for monitoring a status of at least one current-carrying electrical component of two or more current-carrying electrical components, to which electrical energy is suppliable from an electrical energy source via a common current feed line and from the common current feed line via a separate current supply line of a plurality of current supply lines, to each respective at least one current-carrying electrical component, the at least one current-carrying electrical component being individually openable or closable via a switching process, the method comprising:
   detecting, in a first time frame before a second time frame, at a node on the common current feed line before the common current feed line splits to the plurality of current supply lines, at least one first measured value of an electrical variable in the common current feed line, the first time frame being before a switching process in at least one current supply line of the plurality of current supply lines,
   detecting, in the second time frame, at least one second measured value of the electrical variable, the second time frame being after the switching process;
   calculating a difference between the at least one first measured value and the at least one second measured value; and
   determining a status change of the at least one current-carrying electrical component based upon a time series of the difference,
   wherein parameters of the first time frame and the second time frame are settable.

2. The method of claim 1, further comprising:
   setting the parameters of the first time frame and the second time frame depending on an application in which the two or more current-carrying electrical components are operated.

3. The method of claim 2, further comprising:
   storing the parameters of the first time frame and the second time frame in a storage device depending on the application.

4. The method of claim 1, further comprising:
   performing a first switching process in a first current supply line of the plurality of current supply lines after a delay after a second switching process in a second current supply line of the plurality of current supply lines.

5. The method of claim 1, wherein the detecting the at least one first measured value and the at least one second measured value includes detecting the at least one first measured value and the at least one second measured value via at least one sensor, and the method further includes,
   transmitting the at least one first measured value and the at least one second measured value from the sensor to a processor for further processing via an unclocked direct communication link.

6. The method of claim 1, further comprising:
   transmitting control signals for switching a current supply line of the plurality of current supply lines from a processor, configured to generate the control signals, to the current supply line via an unclocked direct communication link.

7. The method of claim 1, further comprising:
   transmitting the at least one first measured value and the at least one second measured value into a communication network via an interface unit.

8. The method of claim 1, further comprising:
   detecting a synchronization effect in a multiphase alternating current by evaluating a current strength in respective current phases of the plurality of current supply lines; and
   changing a switching delay between the current phases such that contacts of a switching device, which carries out the switching of the current phases, wear evenly in response to the detected synchronization effect.

9. A non-transitory computer program product storing a computer program for monitoring a status of at least one of two or more current-carrying electrical components, the computer program being executable in a processor of a control and measuring device and being designed to perform the method of claim 1 when executed by the processor.

10. The method of claim 1, wherein a first length of the first time frame and a second length of the second time frame, and a first temporal distance of the first time frame and a second temporal distance of the second time frame to a point in time of the switching process, are settable.

11. The method of claim 4, wherein the delay is within 10 to 1000 ms.

12. The method of claim 2, wherein the detecting the at least one first measured value and the at least one second measured value includes detecting the at least one first measured value and the at least one second measured value via at least one sensor, and the method further includes,
   transmitting the at least one first measured value and the at least one second measured value from the sensor to a processor for further processing via an unclocked direct communication link.

13. A non-transitory computer readable medium storing a computer program for monitoring a status of at least one of the two or more current-carrying electrical components, the computer program being executable in a processor of a control and measuring device and being designed to perform the method of claim 2 when executed by the processor.

14. A control and measuring device, comprising:
   a sensor configured to detect, at a node on a common current feed line before the common current feed line splits to a plurality of current supply lines, at least one first measured value of an electrical variable in the common current feed line in a first time frame before a second time frame and detect at least one second measured value of the electrical variable in the common current feed line in the second time frame, the first time frame being before a switching process in one or a plurality of the plurality of current supply lines and the second time frame being after the switching process, wherein electrical current is carried to two or more current-carrying electrical components from an electrical energy source via the common current feed line and wherein the electrical current is carried from the common current feed line via a separate current supply line, of the plurality of current supply lines, to each respective at least one current-carrying electrical component, the two or more current-carrying electrical components being individually openable or closable via the switching process; and a processor to
- calculate a difference between the at least one first measured value, detected before the switching process, and the at least one second measured value, detected after the switching process,
- determine a status change of the at least one current-carrying electrical component based upon a time series of the difference, and
- set parameters of the first time frame and the second time frame.

15. The control and measuring device of claim 14, further comprising:
a storage device configured to store the at least one first measured value and the at least one second measured value.

16. The control and measuring device of claim 14, further comprising:
a communication interface configured to transmit the at least one first measured value and the at least one second measured value into a communication network.

17. The control and measuring device of claim 15, further comprising:
a communication interface configured to transmit the at least one first measured value and the at least one second measured value into a communication network.

* * * * *